(12) United States Patent  
Ausserlechner

(10) Patent No.: US 10,203,224 B2  
(45) Date of Patent: Feb. 12, 2019

(54) SENSOR PACKAGE

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 60 days.

(21) Appl. No.: 15/370,491

(22) Filed: Dec. 6, 2016

(65) Prior Publication Data

US 2017/0219382 A1 Aug. 3, 2017

(30) Foreign Application Priority Data

Jan. 28, 2016 (DE) .................. 10 2016 101 542

(51) Int. Cl.
| | |
|---|---|
| *G01B 7/30* | (2006.01) |
| *G01D 5/16* | (2006.01) |
| *G01R 33/00* | (2006.01) |
| *G01D 5/14* | (2006.01) |
| *G01R 33/038* | (2006.01) |

(52) U.S. Cl.
CPC ............ *G01D 5/16* (2013.01); *G01D 5/145* (2013.01); *G01R 33/0047* (2013.01); *G01R 33/0385* (2013.01)

(58) Field of Classification Search
CPC .......... G01D 5/145; G01D 5/20; G01D 5/142; G01D 5/16; G01B 7/30; G01R 33/0047
USPC ...... 324/207.25, 207.11, 207.2–207.26, 209, 324/210, 750.12, 750.21, 754.17
See application file for complete search history.

(56) References Cited

U.S. PATENT DOCUMENTS

| | | | | |
|---|---|---|---|---|
| 2,804,515 | A | * 8/1957 | Heggen | D07B 7/08 200/19.2 |
| 3,530,317 | A | * 9/1970 | Walter | G01D 5/145 310/10 |
| 4,275,291 | A | 6/1981 | Feller | |
| 6,275,027 | B1 | * 8/2001 | Kogure | G01B 7/30 324/207.2 |
| 7,154,262 | B2 | * 12/2006 | Kamizono | G01D 5/145 324/207.25 |
| 7,355,390 | B2 | * 4/2008 | Kogure | G01D 5/14 324/207.25 |
| 7,385,394 | B2 | * 6/2008 | Auburger | G01P 3/488 324/207.25 |
| 8,278,914 | B2 | * 10/2012 | Tanaka | G01D 5/145 324/167 |
| 9,062,988 | B2 | * 6/2015 | Steinich | G01D 5/145 |
| 2007/0103149 | A1 | 5/2007 | Horie et al. | |
| 2007/0151322 | A1 | * 7/2007 | Steinich | G01D 5/04 73/1.75 |

(Continued)

FOREIGN PATENT DOCUMENTS

| | | |
|---|---|---|
| EP | 1544579 | 6/2005 |
| EP | 2693169 | 2/2014 |

*Primary Examiner* — Jermele M Hollington
*Assistant Examiner* — Taqi Nasir
(74) *Attorney, Agent, or Firm* — Harrity & Harrity, LLP

(57) ABSTRACT

A device for detecting an object is suggested comprising a magnetic field sensor, a magnet that is arranged to rotate in a vicinity of the magnetic field sensor, wherein the object is movable in the vicinity of the magnet to affect the rotation of the magnet, wherein the magnetic field sensor is arranged to detect a magnetic field of the magnet. Also, a system comprising such device is provided.

20 Claims, 6 Drawing Sheets

(56) References Cited

U.S. PATENT DOCUMENTS

| | | |
|---|---|---|
| 2009/0072816 A1 | 3/2009 | Schrubbe et al. |
| 2010/0045271 A1* | 2/2010 | Tanaka .................. G01D 5/145 |
| | | 324/207.13 |
| 2011/0175600 A1 | 7/2011 | Jerance et al. |
| 2012/0153940 A1 | 6/2012 | Schrubbe et al. |
| 2015/0022192 A1 | 1/2015 | Ausserlechner |
| 2015/0137796 A1 | 5/2015 | Ausserlechner |
| 2015/0355291 A1* | 12/2015 | Elian .................. G01R 33/0052 |
| | | 324/207.2 |
| 2016/0016607 A1* | 1/2016 | Yoshida .................. B62D 6/10 |
| | | 180/446 |

* cited by examiner

SENSOR PACKAGE

RELATED APPLICATION

This application claims priority under 35 U.S.C. § 119 to German Patent Application No. 102016101542.3, filed on Jan. 28, 2016, the content of which is incorporated by reference herein in its entirety.

BACKGROUND INFORMATION

Embodiments of the present invention relate to a sensor package for determining a position or movement of a moveable object, which moves in the vicinity of such sensor package.

SUMMARY

A first embodiment relates to a device for detecting an object, comprising:
- a magnetic field sensor,
- a magnet that is arranged to rotate in a vicinity of the magnetic field sensor,
- wherein the object is movable in the vicinity of the magnet to affect the rotation of the magnet,
- wherein the magnetic field sensor is arranged to detect a magnetic field of the magnet.

A second embodiment relates to a system comprising:
- an object that is movable,
- a magnetic field sensor,
- a magnet that is arranged to rotate in a vicinity of the magnetic field sensor,
- wherein the object is movable in the vicinity of the magnet to affect the rotation of the magnet,
- wherein the magnetic field sensor is arranged to detect a magnetic field of the magnet.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF THE PREFERRED EMBODIMENTS

Embodiments relate to magnetic position sensors that measure a position coordinate of an object via a magnetic field.

A small permanent magnet may be attached to a movable object and a magnetic field sensor may be placed on a nearby stator. When the object moves, the permanent magnet moves, which results in a change of the magnetic field detected by the magnetic field sensor. Due to a relationship between position and magnetic field, the magnetic field sensor is able to compute the position of the object based on magnetic field measurement.

The magnetic field sensor may measure at least one magnetic field component. It may also measure at least one gradient of at least one magnetic field component, i.e. a spatial derivative of the magnetic field components along a predetermined direction, e.g., dBx/dx, dBx/dz, dBz/dy, etc. The magnetic field sensor may combine measured magnetic quantities, e.g., linear combinations and/or ratios and/or arctangents thereof. In addition, the magnetic field sensor or any signal provided by it may utilize a look-up table or any non-linear interpolation function.

The object itself may be moved along a straight path or along a curved path. The path may be in a plane or it may be an arbitrary path in space (i.e. a spaced curve). The path may also be on a circle (in case of a rotation sensor) or on a helix (in case of a multi-turn rotation sensor).

Magnetic disturbances may corrupt the position measurement of the object. Strong magnets may be used for generating strong magnetic fields. Also, magnet and sensor may be arranged together with a magnetic shield to shield off external magnetic disturbances.

An advantage of the solution provided herein is an improved measurement of a position of the moveable object. This is achieved via an easy to produce and hence cost-efficient solution. Also, large strokes can be measured with good accuracy.

According to an example embodiment, a magnetic force between a movable object and a magnet is used, wherein the magnet is held by a bearing that allows for its movement, when a magnetic force impacts the magnet. The movable object exerts force on the magnet, when the object moves. Hence, there are at least two movable parts: the movable object and the magnet. The magnetic field sensor detects the magnetic field, which changes due to the moving magnet.

Example: Bearing

Figure 1:
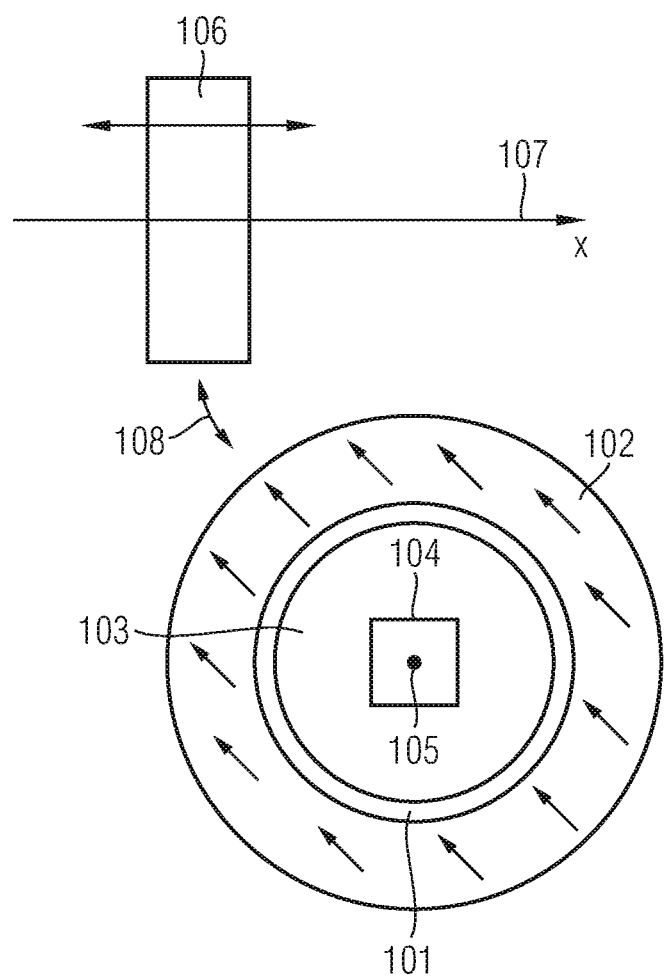
FIG. 1 shows a bearing that allows for a rotational movement of an outer part in view of an inner part, wherein a movement of a movable object is detectable by a magnetic field sensor via a magnetic field change that results from a movement of the outer part.

FIG. 1 shows a bearing that allows for a rotational movement of an outer part 102 in view of an inner part 103. The inner part 103 and the outer part 102 are separated by a small clearance 101, which may be an air gap of, e.g., 1/10 mm. The inner part 103 comprises a sensor chip 104 with a magnetic field sensor element 105. The magnetic field sensor element 105 may comprise XMR-angle sensors.

The magnetic field sensor element 105 may comprise a giant magneto resistive (GMR), a tunnel magneto resistive (TMR), an anisotropic magneto resistive (AMR) or any other such sensor element, which may be referred to as XMR sensor element. The XMR technology may be utilized, in rotational speed sensors comprising a pole wheel transducer wheel or ferrous wheel in combination with a magnetic back bias field perpendicular to the sensor plane.

The bearing itself may preferably be (substantially) nonmagnetic, i.e. it does not significantly change magnetic fields that permeate the bearing.

The outer part 102 may be a ring magnet or it may comprise a ring magnet. In the example shown in FIG. 1, the outer part 102 is a ring magnet. The outer part 102 may be arranged to rotate freely around the inner part 103.

A moveable object 106 moves along an axis 107 (here, e.g., depicted as an x-axis). The object 106 may comprise iron or a material with a large relative permeability, e.g., $\mu_r > 100$. As an option, at least a portion of the object 106 has permanent magnetic characteristics.

Hence, there is a magnetic force 108 between the object 106 and the outer part 102 (which in this example is a ring magnet): if the object 106 is ferrous, this force is attractive; if the object 106 is permanent magnetic, this force is attractive if the ring is free to rotate in its favored position. It is also an option that other forces, e.g., a spring force, may act on the outer part 102, which may lead to a repulsive force between the outer part 102 and the object 106.

The magnetic field sensor element 105 may thus detect a direction of the magnetic field 108, which direction is linked to the position of the object 106 along the axis 107; as the axis 107 is exemplarily an x-axis, an x-coordinate may correspond to the field detected by the magnetic field sensor element 105. Hence, the sensor chip 104 may process this x-coordinate or it may convey the (processed) x-coordinate to a further processing device.

Further Example Sensor Arrangements

Hereinafter a few arrangements are shown, each comprising a magnetic field sensor element and a magnet, wherein a movable object may influence the position of the magnet, which thereby changes the magnetic field detected by the magnetic field sensor element. Hence, the signal detected by the magnetic field sensor element is based on the position or movement of the movable object.

Figure 2:
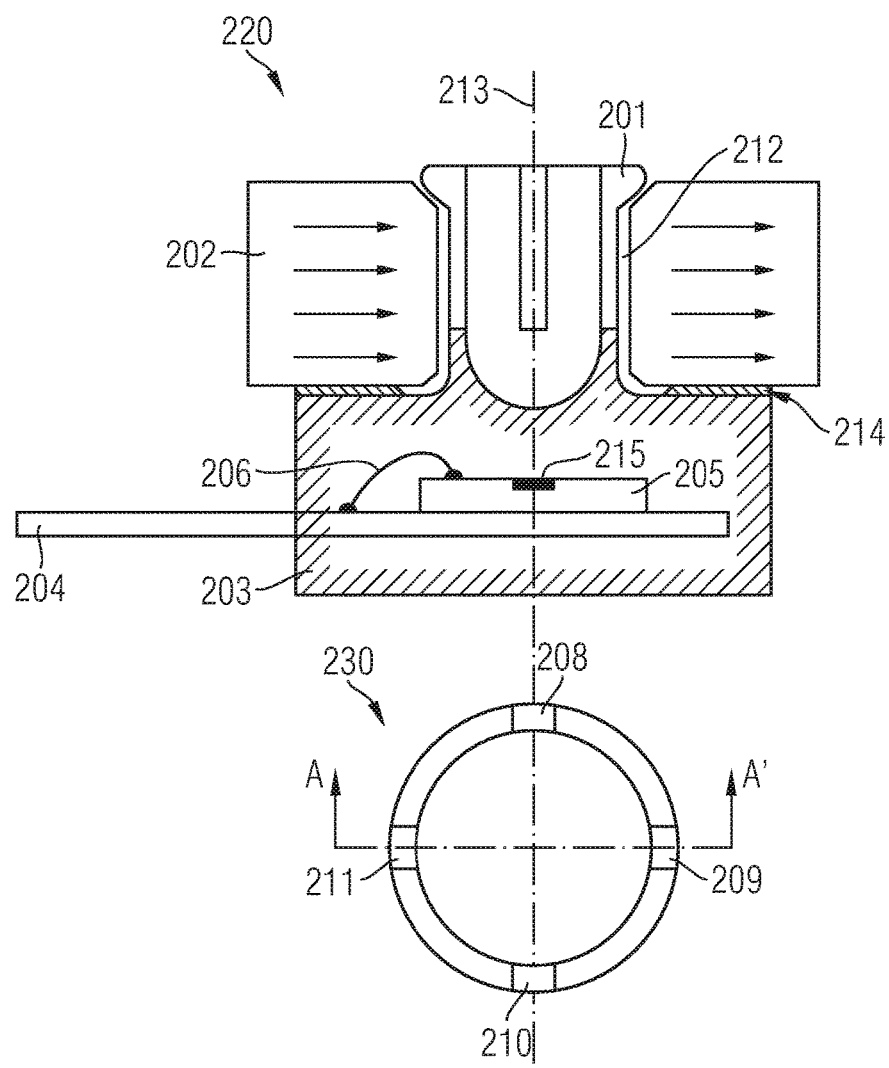
FIG. 2 shows a cross-section and a plan view of a modified sensor package that allows detecting a position of a movable object.

FIG. 2 shows a cross-section 220 and a plan view 230 of a modified sensor package.

A leadframe 204 to which a chip 205 is connected via bond wires 206 is at least partially part of a mold compound 203, which has a pivot 201 at its top surface. The chip 205 comprises at least one sensor element 215. Over the pivot 201 a magnet 202 (ring magnet) is slipped.

The pivot 201 has four tongues 208 to 211, which are shown in the plan view 230 of FIG. 2. The tongues 208 to 211 are bent towards a center axis 213 (i.e. rotation axis) during the assembly procedure when the magnet 202 is pulled over the pivot 201; the tongues 208 to 211 snap back after the magnet 202 reaches its final position. Hence, the tongues 208 to 211 being in the position shown in FIG. 2 prevent the magnet 202 from getting lost. The magnet 202 is rotatable around the center axis 213 (i.e. the center of the tongues 208 to 211), wherein a clearance 212 is provided at least partially between the magnet 202 and the tongues 208 to 211. The clearance 212 may amount to, e.g., 1/10 mm.

In addition, at least one seat 214 is provided between the magnet 202 and the mold compound 203, on which the magnet 202 can glide in a well-defined distance to the at least one sensor element 215 of the chip 205.

As an option, the package may be a surface mounted device (SMD) or a leadless package like a Quad Flat No Leads Package (QFN), a very thin QFN (VQFN) or the like.

The mold compound 203 of the package may have a high percentage of quartz filler, which acts as abrasive. This may be problematic around the pivot 201 and the bore of the magnet 202. It may also impair the flexibility of the tongues 208 to 211. Hence, it may be beneficial to use an additional mold compound (not shown in FIG. 2), which is less (or non) abrasive, around the mold compound 203 comprising the quartz filler.

As an alternative or in addition, a (e.g., thin) gliding surface may be added to the inner bore of the magnet 202 and/or to its lower plane face and/or to the mold compound 203; it is in particular beneficial to apply such gliding surface to the faces of the magnet 202, which are or may come in contact with parts of mold compound 203 (in particular with the stator of the mold compound 203, when the magnet 202 rotates around the pivot 201).

Figure 3:
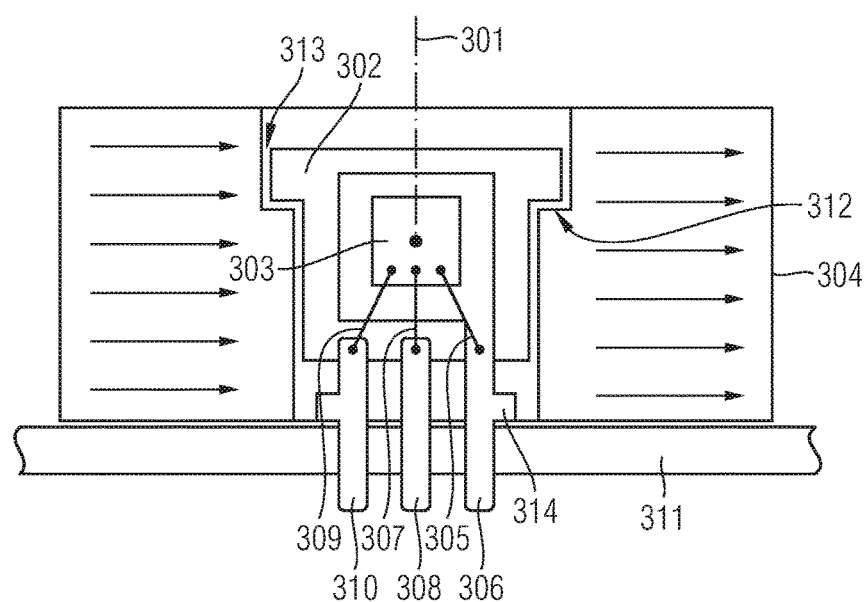
FIG. 3 shows an alternative embodiment of a sensor package, wherein the magnet is held by a protrusion of a mold compound.

FIG. 3 shows an alternative embodiment of a sensor package. A mold compound 302 comprises a chip 303 (sensor chip with sensor elements). The chip 303 is connected with bonding wires 305, 307 and 309 to pins 306, 308 and 310, wherein each of the pins 306, 308 and 310 is at least partially embedded in the mold compound 302. The pins 306, 308 and 310 are connected with a printed circuit board 311 (PCB), e.g., by being soldered to conducting paths of the PCB 311.

The mold compound 302 may act as a stator and it may be substantially arranged symmetrically (e.g., round) such that a magnet 304 can rotate around the mold compound 302 with regard to a rotation axis 301.

In the example of FIG. 3, the magnet 304 may have a shoulder 312 on the inner diameter of the magnet 304 onto which a protrusion of the mold compound 302 is arranged to hold the magnet 304 in place (at least partially) between the PCB 311 and the mold compound 302.

A clearance 313 may be provided between the mold compound 302 and the magnet 304, substantially in parallel to the rotation axis 301.

In this example of FIG. 3, the magnet 304 is large enough to encircle the chip 303. It is an advantage that the chip 303 is close to or in its symmetry point, e.g., at or at least near the rotation axis 301, which minimizes position detection errors that would otherwise be caused by assembly tolerances of the chip 303 and the magnet 304. In addition, the magnetic field is larger in the center of the bore of the magnet 304.

The vertical position of the chip 303 as well as the mold compound 302 within the magnet 304 can be defined by at least one nose 314, which may be applied to at least one of the pins 306, 308 and 310.

The dimensions of the arrangement shown in FIG. 3 are chosen such that the magnet 304 can freely rotate around the mold compound 302. The mold compound 302 may be flat, i.e. its thickness into the drawing plane may be small, e.g., 1 mm, or it may be cylindrical with the cylinder axis identical to the rotation axis 301.

In the examples shown in FIG. 1 and FIG. 2, magnetoresistors or vertical Hall sensor devices may be used as magnetic field sensor elements. In the example shown in FIG. 3, Hall plates and vertical Hall sensor devices may be used to detect the magnetic field on the rotation axis 301.

Figure 4:
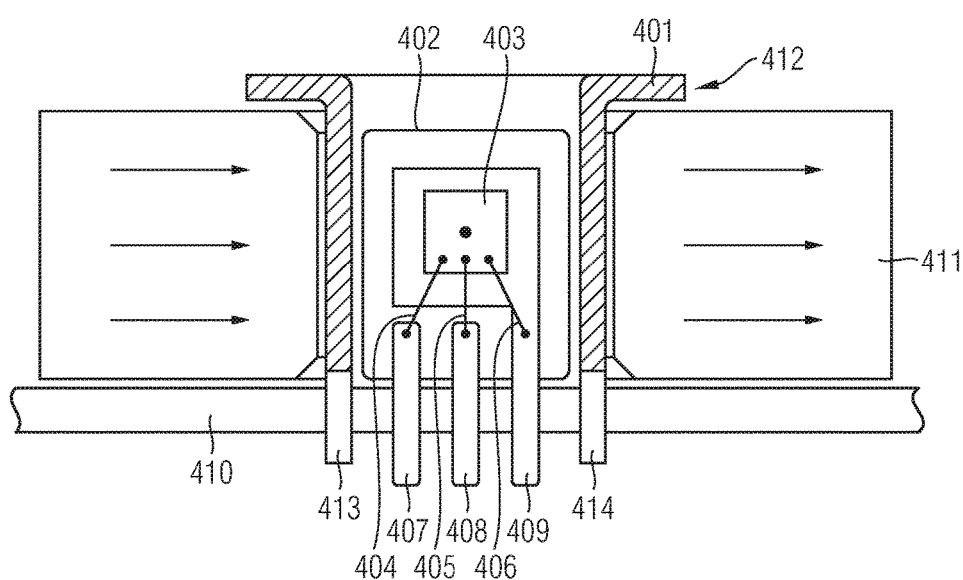
FIG. 4 shows yet an alternative example of a sensor package comprising a pivot for holding the magnet.

FIG. 4 shows an example arrangement with an extra pivot 401 that accommodates a mold compound 402 (as stator) in its bore.

The mold compound 402 comprises a chip 403 (sensor chip with sensor elements). The chip 403 is connected with bonding wires 404 to 406 to pins 407 to 409, wherein each of said pins 407 to 409 is at least partially embedded in the mold compound 402. The pins 407 to 409 are soldered into a printed circuit board 410 (PCB).

The pivot 401 may comprise at least one pin 413, 414, via which the pivot 401 is connected to the PCB 410. Also, the pivot 401 comprises a shoulder 412 so that a (round) magnet 411 can freely rotate between the PCB 410 and the shoulder 412 of the pivot 401.

The pivot 401 can be made by a thin-walled metal and its shoulder 412 may be located at the upper end to prevent the magnet 411 from getting lost. The pins 413 and 414 may then be located at the lower end of the pivot 401. Instead of such pins 413, 414, springs or tongues may be provided (not shown in FIG. 4), which are inserted into holes in the PCB 410 to attach the pivot 401 to the mold compound 402.

The pins 413, 414 can be soldered into the PCB 410 like the pins 407 to 409 that are attached to the mold compound 402.

As an alternative (or even in addition), the pivot may be pulled over the magnet and snapped onto the PCB via elongated springs after the pins of the mold compound have been soldered to the PCB. This prevents the magnet from getting heated up during soldering procedure. Many other approaches may be applicable to achieve a similar arrangement.

Figure 5:
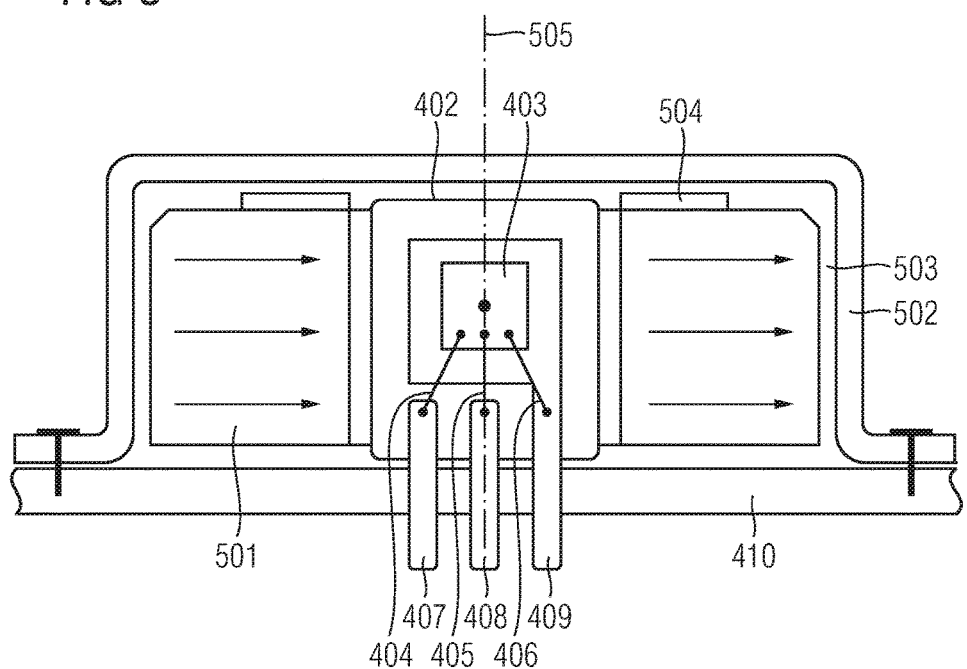
FIG. 5 shows a further example of a sensor package comprising a can surrounding (and holding) the magnet to rotate around the mold compound comprising the magnetic field sensor.

FIG. 5 shows an arrangement that is in some way an inversion of what is depicted in FIG. 4. In FIG. 5, the mold compound 402 has pins 407 to 409 sticking out and being soldered into the PCB 410. Contrary to FIG. 4, in FIG. 5 a round magnet 501 surrounds the mold compound 402. A can 502 covers the mold compound 402 and the magnet 501, wherein the can is also connected with the PCB 410 (e.g., bolted to the PCB 410) to prevent the magnet 501 from getting lose. The can 502 may be made of metal. The outer surface of the magnet 501 may slide against the can 502, which may prevent the inner surface of the magnet 501 from touching the mold compound 402 thereby avoiding any abrasion between the mold compound 402 and the magnet 501.

It is another option to hermetically seal the magnet 501 and the mold compound 402 in the can 502. In order to provide alignment to a rotation axis 505, the can 502 may provide some protrusions or dowels (not shown in FIG. 5). Also, the magnet 501 may have a seat 504 to define a gliding surface between the magnet 501 and the can 502; thereby, tolerance issues of a clearance 503 between the can 502 and the magnet 501 that stem from rounded edges of the can 502 can be avoided (or at least mitigated). Such clearance 503 is located substantially parallel to the rotation axis 505.

It is noted that the arrangements depicted in FIG. 2 to FIG. 5 comprise sensor packages that allow detecting a position of a moveable object as also shown in FIG. 1. The moveable object (not separately depicted in FIG. 2 to FIG. 5) affect the position of the rotatable magnet 202, 304, 411 and 501, wherein the rotation or position of the magnet 202, 304, 411 and 501 results in a magnetic field detectable by the chip 205, 303 and 403.

It is further noted that the stroke of the movement of the magnet may be increased in case the movable object (see FIG. 1) also has a permanent magnet, because at a distance of, e.g., more than 10 mm between the outer part 102 and the object 106 the force between two permanent magnets is larger than the force between an iron part and a permanent magnet.

It is additionally noted that the at least one sensor element (on the chip) may be arranged such that it not only detects the magnetic field of the rotatable permanent magnet (102, 202, 304, 411, 501), it may also detect additional magnetic fields, which change during movement of the movable object: if the movable object has a permanent magnet the field of this magnet is superimposed on the field of the rotatable magnet. If the movable object has ferrous parts they become magnetized under the action of the rotatable magnet, which results in small additional magnetic fields.

Example Shielding

So far the embodiments did not show any shielding, because the magnet needs to interact with the movable object and the magnetic sensor element needs to detect the field of the magnet.

Figure 6:
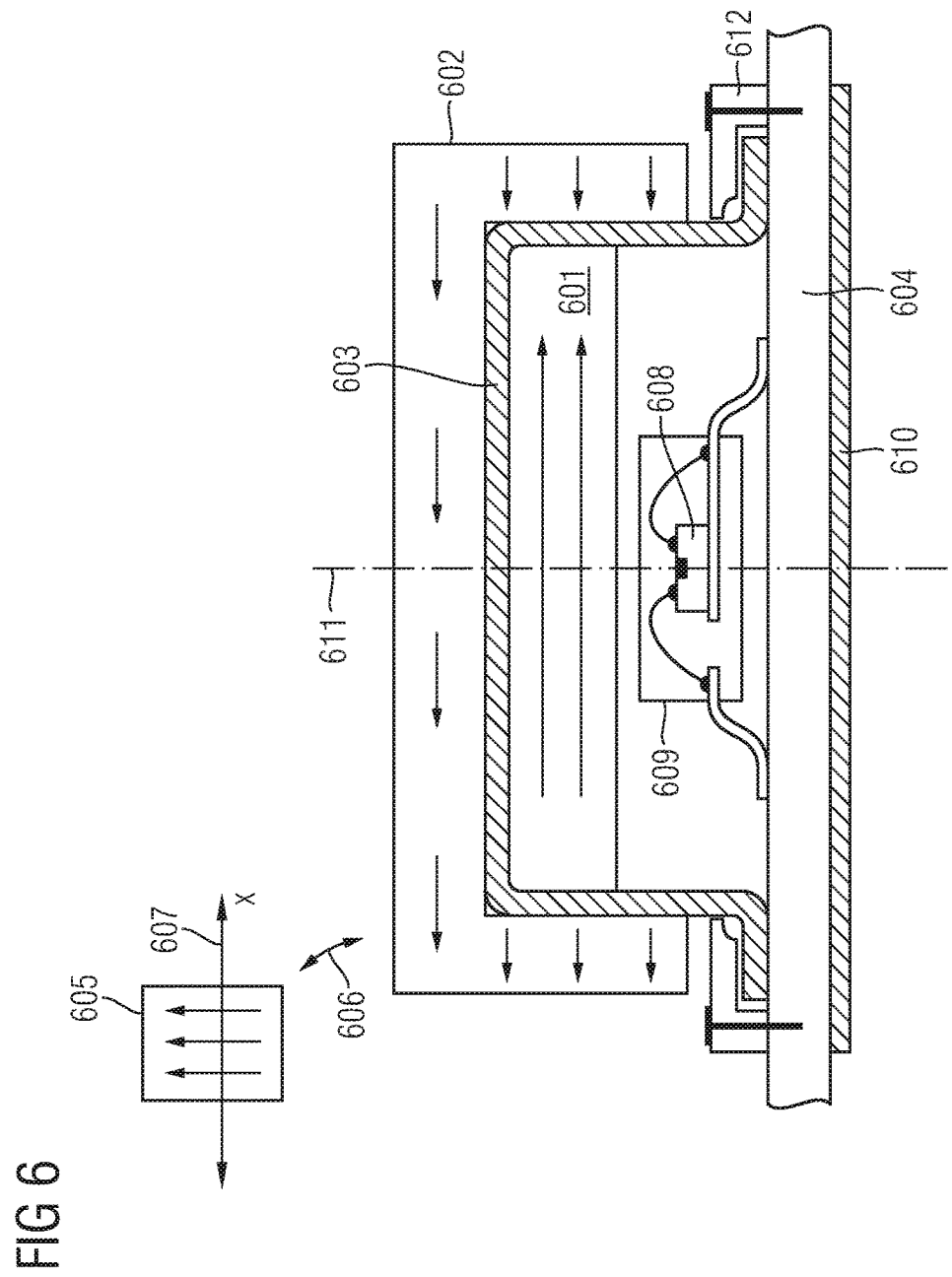
FIG. 6 shows an additional example of a sensor package with a shield arranged between an inner magnet and an outer magnet, wherein the combination of inner magnet, shield and outer magnet are arranged to rotate in the vicinity of the magnetic field sensor.

FIG. 6 shows an arrangement that utilizes shielding and still allows detecting the field of the magnet by the magnetic field sensor, wherein such field is influenced by the movement of the object.

In FIG. 6 the magnet is split into an inner magnet 601 and an outer magnet 602. A shield 603 is arranged between the inner magnet 601 and the outer magnet 602.

The outer magnet 602 generates a force 606 coupling to the (movable) object 605. The object 605 can be moved along an axis 607 (exemplarily referred to as x-axis). The inner magnet 601 generates a field for at least one magnetic sensor element of a chip 608.

In the example shown in FIG. 6, the chip 608 is cast in a mold compound 609, which is electrically connected to a PCB 604. Bonding wires may be used to electrically connect the chip 608 to pins, wherein each pin is at least partially embedded in the mold compound 609. The pins may be electrically connected, e.g., soldered, to the PCB 604.

Another shield 610 may be arranged at the bottom of the PCB 604, i.e. to the side of the PCB 604 opposing the chip 608. This shield 610 is optional.

The shield 603 may reduce errors caused by external magnetic fields. The shield 603 may advantageously have a large permeability, e.g., $\mu_r > 100$.

The inner magnet 601, the shield 603 and the outer magnet 602 are preferably fixed to each other with no or only little movement between them. This combination of the inner magnet 601, the shield 603 and the outer magnet 602 rotates around a rotation axis 611 inside a collar 612. The collar 612 may be of plastic which allows the shield 603 to rotate.

The inner magnet 601 is a field magnet, which generates the field for the magnetic sensor element on the chip 608 and the outer magnet 602 is a force magnet, which generates the force to the movable object 605.

The inner magnet 601 and the outer magnet 602 may (but does not have to) be of different material(s), different shape(s), different size(s) and/or different direction(s) of magnetization.

Further Embodiments and Examples

It is further noted that the movable object may also be a rotatable object or it may comprise a rotatable portion that rotates around a rotation axis, which is different from the rotation axis of the magnet (the magnet being, e.g., one of 102, 202, 304, 411, 501, 601 and 602). For example, both rotation axes may be parallel but they may be shifted laterally against each other. In this manner it is possible to provide an off-axis angle sensor, i.e. a sensor that detects the rotational position of a first axis wherein the first axis and the rotation axis of the magnet are not identical. In an example embodiment, the first axis and the rotation axis of the magnet may be shifted against each other, they may be parallel, not parallel or even perpendicular to each other. The rotatable portion can also be permanently magnetized.

It is another option that the rotatable portion or the magnet can be a multi-pole (i.e. having more than one pole-pair). By combining multi-poles of different pole-pair number between movable object and magnet it is possible to construct a system with a ratio, which is different to 1:1. Such system can be used to make a multi-turn angle sensor which measures, e.g., five full revolutions (i.e. 5*360°) and it can be used for determining a steering-angle, e.g., of a steering wheel.

It is also an option that each of the magnets is diametrically magnetized. As an alternative, the magnet may have a so-called Halbach magnetization. This may be beneficial in case there is a magnetic shield between two magnets (see, e.g., FIG. 6).

The examples suggested herein may in particular be based on at least one of the following solutions. In particular combinations of the following features could be utilized in order to reach a desired result. The features of the method could be combined with any feature(s) of the device, apparatus or system or vice versa.

A device is suggested for detecting an object, the device comprising:
- a magnetic field sensor,
- a magnet that is arranged to rotate in a vicinity of the magnetic field sensor,
- wherein the object is movable in the vicinity of the magnet to affect the rotation of the magnet,
- wherein the magnetic field sensor is arranged to detect a magnetic field of the magnet.

Because of the vicinity between the object and the magnet, the rotational position of the magnet is responsive to a magnetic force between the object and the magnet. Hence the magnet is arranged such that the magnetic force between the object and the magnet results in a rotational movement of the magnet. The magnetic field sensor is arranged to detect the magnetic field of the magnet, in particular the magnetic field change that results in a movement (rotation) of the magnet. Hence, the magnetic field sensor is arranged such that the magnetic force between the magnet and the magnetic field sensor can be determined. The amount of movement indicates the position of the object.

It is noted that the rotation of the magnet may be any movement of the magnet comprising a rotational portion. For example, the magnet may rotate around a rotation axis or may describe some sort of elliptic rotation comprising a lateral movement component.

It is noted that the magnet may be a component comprising some magnetic characteristics such that a magnetic field (change) can be detected by the magnetic field sensor.

The magnetic field sensor may comprise at least one magnetic field sensor element. The magnetic field may be a chip or it may be arranged in a chip or on a surface of a chip.

The magnetic field sensor may measure at least one magnetic field component. It may also measure at least one gradient of at least one magnetic field component, i.e. a spatial derivative of the magnetic field components along a predetermined direction, e.g., dBx/dx, dBx/dz, dBz/dy, etc. The magnetic field sensor may combine measured magnetic quantities, e.g., linear combinations and/or ratios and/or arctangents thereof. In addition, the magnetic field sensor or any signal provided by it may utilize a look-up table or any non-linear interpolation function.

The object may move along a straight path or along a curved path. The path may be in a plane or it may be an arbitrary path in space (i.e. a spaced curve). The path may also be on a circle (in case of a rotation sensor) or on a helix (in case of a multi-turn rotation sensor).

The object may comprise iron or a material with a large relative permeability, e.g., $\mu_r > 100$. As an option, at least a portion of the object has permanent magnetic characteristics.

In an embodiment, the magnet is arranged to rotate due to a magnetic force between the magnet and the object.

In an embodiment, said device is a sensor arrangement or a sensor package for detecting a position or movement of the object.

In an embodiment, the device comprises a stator, wherein the magnetic field sensor is attached to or embedded in the stator.

In an embodiment, the magnet is arranged to rotate around the stator.

In an embodiment, the magnet is arranged to rotate around a rotation axis, wherein the magnetic field sensor may be arranged at or in the vicinity of the rotation axis.

In an embodiment, the magnetic field sensor is arranged on a chip, which is electrically connected to pins, wherein said pins are at least partially embedded in a mold compound, wherein the pins are electrically connected to a component board.

The component board may be any substrate comprising at least one component, e.g., a printed circuit board (PCB).

In an embodiment, the mold compound comprises at least one tongue for holding the magnet.

As an option, at least two tongues may be used for holding the magnet.

In an embodiment, mold compound comprises at least one seat on which the magnet is pivoted.

In an embodiment, the mold compound comprises at least one protrusion to hold the magnet between the component board and the mold compound.

In an embodiment, the device further comprises a pivot that is connected to the component board, wherein the pivot is arranged around the mold compound and wherein the pivot comprises a shoulder or a protrusion for holding the magnet between the shoulder or the protrusion and the component board.

In an embodiment, the device further comprises a can that is connected to the component board, wherein the can is arranged to hold the magnet and to allow the magnet to rotate around the mold compound.

In an embodiment,
- the magnet comprises an inner magnet and an outer magnet,
- a shield is arranged between the inner magnet and the outer magnet,
- the inner magnet is arranged in the vicinity of the magnetic field sensor,
- the outer magnet is arranged in the vicinity of the object,
- the arrangement comprising the inner magnet, the shield and the outer magnet is arranged to rotate in the vicinity of the magnetic field sensor.

Hence, the inner magnet may be arranged next to the magnetic field sensor, whereas the outer magnet may be arranged next to the (moveable) object.

In an embodiment, the shield is rotatably connected to the component board.

In an embodiment, the inner magnet and the outer magnet differ in at least one of the following:
- material,
- shape,
- size,
- direction of magnetization,
- magnetization pattern.

In an embodiment, said object is a rotatable object or it comprises a rotatable portion that rotates around a rotation axis that is different from a rotation axis of the magnet.

In addition, a system is suggested comprising
an object that is movable,
a magnetic field sensor,
a magnet that is arranged to rotate in a vicinity of the magnetic field sensor,
wherein the object is movable in the vicinity of the magnet to affect the rotation of the magnet,
wherein the magnetic field sensor is arranged to detect a magnetic field of the magnet.

In an embodiment, the system further comprises a stator, wherein the magnetic field sensor is attached to or embedded in the stator.

Although various example embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A device for detecting an object, comprising:
a magnetic field sensor; and
a magnet that is arranged to rotate around an axis at the magnetic field sensor,
the magnetic field sensor being encircled by the magnet,
the object being movable in a vicinity of the magnet to affect a rotation of the magnet, and
the magnetic field sensor being arranged to detect a change of a magnetic field of the magnet based on a movement of the object.

2. The device of claim 1, wherein the magnet is arranged to rotate due to a magnetic force between the magnet and the object.

3. The device of claim 1, further comprising:
a stator,
the magnetic field sensor being attached to or embedded in the stator.

4. The device of claim 3, wherein the magnet is arranged to rotate around the stator.

5. The device of claim 1, wherein the magnetic field sensor is arranged on a chip,
the chip being electrically connected to pins,
the pins being at least partially embedded in a mold compound, and
the pins being electrically connected to a component board.

6. The device of claim 5, wherein the mold compound comprises at least one tongue for holding the magnet.

7. The device of claim 5, wherein mold compound comprises at least one seat on which the magnet is pivoted.

8. The device of claim 5, wherein the mold compound comprises at least one protrusion to hold the magnet between the component board and the mold compound.

9. The device of claim 5, further comprising:
a pivot that is connected to the component board,
the pivot being arranged around the mold compound, and
the pivot comprising a shoulder or a protrusion for holding the magnet between the shoulder or the protrusion and the component board.

10. The device of claim 5, further comprising:
a can that is connected to the component board,
can being arranged to hold the magnet and to allow the magnet to rotate around the mold compound.

11. The device of claim 5,
wherein the magnet comprises an inner magnet and an outer magnet,
a shield being arranged between the inner magnet and the outer magnet,
the inner magnet being arranged in a vicinity of the magnetic field sensor,
the outer magnet being arranged in a vicinity of the object, and
the inner magnet, the shield, and
the outer magnet being arranged to rotate in the vicinity of the magnetic field sensor.

12. The device of claim 11, wherein the shield is rotatably connected to the component board.

13. The device of claim 11, wherein the inner magnet and the outer magnet differ in at least one of:
material,
shape,
size,
direction of magnetization, or
magnetization pattern.

14. The device of claim 1, wherein the object is a rotatable object or comprises a rotatable portion that rotates around a rotation axis that is different from the axis at the magnet field sensor.

15. A system comprising:
an object that is movable;
a magnetic field sensor; and
a magnet that is arranged to rotate around an axis at the magnetic field sensor,
the magnetic field sensor being encircled by the magnet,
the object being movable in a vicinity of the magnet to affect a rotation of the magnet, and
the magnetic field sensor being arranged to detect a change of a magnetic field of the magnet based on a movement of the object.

16. The system of claim 15, further comprising:
a stator,
the magnetic field sensor being attached to or embedded in the stator.

17. The system of claim 16, wherein the magnet is arranged to rotate around the stator.

18. The system of claim 15, wherein the magnet is arranged to rotate due to a magnetic force between the magnet and the object.

19. The system of claim 15, wherein the magnetic field sensor is arranged on a chip,
the chip being electrically connected to pins,
the pins being at least partially embedded in a mold compound, and
the pins being electrically connected to a component board.

20. The system of claim 15, wherein the object is a rotatable object or comprises a rotatable portion that rotates around a rotation axis that is different from the axis at the magnet field sensor.

* * * * *